United States Patent
Han et al.

(10) Patent No.: US 10,210,944 B2
(45) Date of Patent: Feb. 19, 2019

(54) INVERTER AND METHOD FOR DRIVING THE INVERTER, GATE ON ARRAY UNIT AND GATE ON ARRAY CIRCUIT

(71) Applicant: BOE TECHNOLOGY GROUP CO., LTD., Beijing (CN)

(72) Inventors: Seung Woo Han, Beijing (CN); Yuanbo Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 143 days.

(21) Appl. No.: 15/163,913

(22) Filed: May 25, 2016

(65) Prior Publication Data

US 2016/0351109 A1 Dec. 1, 2016

(30) Foreign Application Priority Data

May 26, 2015 (CN) .......................... 2015 1 0275571

(51) Int. Cl.
*G11C 19/00* (2006.01)
*G11C 19/28* (2006.01)
*G09G 3/20* (2006.01)
*G09G 3/36* (2006.01)

(52) U.S. Cl.
CPC ............... *G11C 19/28* (2013.01); *G09G 3/20* (2013.01); *G09G 3/3677* (2013.01); *G09G 2310/0267* (2013.01); *G09G 2310/0286* (2013.01)

(58) Field of Classification Search
None
See application file for complete search history.

(56) References Cited

U.S. PATENT DOCUMENTS

| 7,978,809 B2 * | 7/2011 | Lai .......................... G11C 19/28 377/64 |
| 9,584,127 B2 * | 2/2017 | Qian ................... H03K 19/0944 |
| 9,734,751 B2 * | 8/2017 | Qian .................... G09G 3/2092 |

(Continued)

FOREIGN PATENT DOCUMENTS

| CN | 102467891 A | 5/2012 |
| CN | 102654978 A | 9/2012 |

(Continued)

OTHER PUBLICATIONS

Chinese Office Action dated Jan. 24, 2017.

*Primary Examiner* — Tuan T Lam

(74) *Attorney, Agent, or Firm* — Dilworth & Baresse, LLP; Michael J. Musella, Esq.

(57) ABSTRACT

An inverter and a method for driving the inverter, a gate driver on array (GOA) unit, a GOA circuit and a display device relate to a technical field of display, and are proposed to supply stable inverter output signal. The inverter comprises a control module and an output module. The control module is configured to control a voltage at a control node under the control of a first clock signal at a first clock signal terminal, a second clock signal at a second clock signal terminal, an input signal at an input terminal and voltages at a first level terminal and a second level terminal. The output module is configured to set a voltage at the output terminal to the voltage at the first level terminal or the voltage at the second level terminal under the control of the control node and the input signal at the input terminal.

19 Claims, 7 Drawing Sheets

(56) References Cited

U.S. PATENT DOCUMENTS

| | | | |
|---|---|---|---|
| 2007/0188196 A1* | 8/2007 | Yu | H03K 19/01714 |
| | | | 326/88 |
| 2008/0101529 A1 | 5/2008 | Tobita | |
| 2014/0145919 A1* | 5/2014 | Qian | G09G 3/3225 |
| | | | 345/82 |
| 2016/0105184 A1* | 4/2016 | Qian | H03K 19/0944 |
| | | | 345/214 |
| 2017/0132968 A1* | 5/2017 | Qian | G09G 3/2092 |

FOREIGN PATENT DOCUMENTS

| | | |
|---|---|---|
| CN | 102708779 A | 10/2012 |
| CN | 103187040 A | 7/2013 |
| CN | 103268749 A | 8/2013 |
| CN | 104269137 A | 1/2015 |
| CN | 104517571 A | 4/2015 |
| JP | 2005143068 A | 6/2005 |

\* cited by examiner

During a first period, the control module controls the voltage at the control node under the control of the first clock signal at the first clock signal terminal, the second clock signal at the second clock signal terminal, the input signal at the input terminal, the voltage at the first level terminal and the voltage at the second level terminal, and the output module sets the voltage at the output terminal to the voltage at the first level terminal under the control of the voltage at the control node ⸺ S51

During a second period, the output module sets the voltage at the output terminal to the voltage at the second level terminal under the control of the voltage at the control node and the input signal at the input terminal ⸺ S52

During a third period, the output module sets the voltage at the output terminal to the voltage at the second level terminal under the control of the voltage at the control node and the input signal at the input terminal ⸺ S53

During a fourth period, the control module controls the voltage at the control node under the control of the first clock signal at the first clock signal terminal, the second clock signal at the second clock signal terminal, the input signal at the input terminal, the voltage at the first level terminal and the voltage at the second level terminal, and the output module sets the voltage at the output terminal to the voltage at the first level terminal under the control of the voltage at the control node ⸺ S54

Fig.5

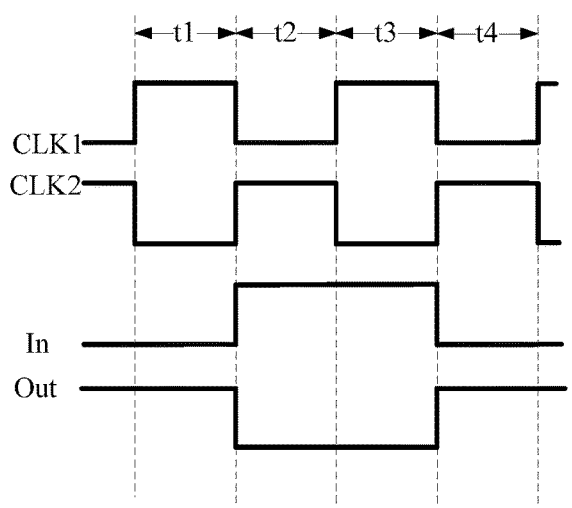

Fig.6

INVERTER AND METHOD FOR DRIVING THE INVERTER, GATE ON ARRAY UNIT AND GATE ON ARRAY CIRCUIT

TECHNICAL FIELD OF THE DISCLOSURE

The present disclosure relates to a technical field of display, and particularly relates to an inverter and a method for driving the inverter, a gate driver on array (GOA) unit, a GOA circuit and a display device.

BACKGROUND

An inverter functions to invert a signal inputted thereto, that is, the input signal and an output signal of the inverter are signals opposite to each other. With development of electronic technology, the inverter has been widely used for example in an emitting driving circuit of an organic light-emitting display device, to provide respective potentials or levels for a pixel compensating circuit electrically connected to the emitting driving circuit, such that the pixel compensating circuit can accomplish node initialization, threshold compensation, data writing, etc.

FIG. 1 illustrates a circuit diagram of a traditional inverter. With reference to FIG. 1, transistors M1 and M2 and an input terminal In and an output terminal Out connected with the transistors M1 and M2 constitute an inverter circuit. Specifically, a clock signal terminal CLKB is connected to a first electrode and a gate of the transistor M1, a second electrode of the transistor M1 is connected to the output terminal Out, a gate of the transistor M2 is connected to the input terminal In, a first terminal of the transistor M2 is connected to the output terminal Out, and a second terminal of the transistor M2 is connected to a low level terminal VGL.

In the above inverter circuit, when the clock signal terminal CLKB is at a high level and the input terminal In is at a high level, the transistors M1 and M2 are both turned on, due to voltage division between a resistor of the transistor M1 and a resistor of the transistor M2, a voltage $V_{out}$ at the output terminal Out can be expressed as follows: $V_{out}=R2/(R1+R2) \cdot (V_{CLKB}-V_{VGL})+V_{VGL}$, where R1 is the resistance value of the transistor M1 when a voltage at the gate of the transistor M1 is $V_{CLKB}$, R2 is the resistance value of the transistor M2 when a voltage at the gate of the transistor M2 is $V_{In}$, $V_{CLKB}$ is the voltage at the clock signal terminal CLKB when the clock signal terminal CLKB is at a high level, $V_{VGL}$ is the voltage at the low level terminal VGL, $V_{In}$ is the voltage at the input terminal In when the input terminal In is at a high level. From the above equation, no matter how small the resistance value of the transistor M2 is, when the clock signal terminal CLKB is at a high level and the input terminal In is at a high level, it is impossible for the voltage $V_{out}$ at the output terminal Out to be reduced to $V_{VGL}$, thus rendering that the output signal of the inverter is affected by characteristics of the Field-Effect-Thin-Film-Transistor (TFT) and is thus unstable.

SUMMARY

In the present disclosure, an inverter and a method for driving the inverter, a gate driver on array (GOA) unit, a GOA circuit and a display device are proposed for supplying a stable inverter output signal.

According to an aspect of the present disclosure, there is provided an inverter comprising a control module and an output module. The control module is connected to a first clock signal terminal, a second clock signal terminal, a first level terminal, a second level terminal, an input terminal and a control node, and is configured to control a voltage at the control node under the control of a first clock signal at the first clock signal terminal, a second clock signal at the second clock signal terminal, an input signal at the input terminal, a voltage at the first level terminal and a voltage at the second level terminal. The output module is connected to the control node, the input terminal, the first level terminal, the second level terminal and an output terminal, and is configured to set a voltage at the output terminal to the voltage at the first level terminal or the voltage at the second level terminal under the control of the control node and the input signal at the input terminal.

According to one embodiment of the present disclosure, the control module comprises a first transistor, a second transistor and a third transistor. A first electrode of the first transistor is connected to the first level terminal, a second electrode of the first transistor is connected to a first electrode of the second transistor, and a gate of the first transistor is connected to the first clock signal terminal. The first electrode of the second transistor is connected to a gate of the third transistor, a second electrode of the second transistor is connected to the second level terminal, and a gate of the second transistor is connected to the input terminal. A first electrode of the third transistor is connected to the second clock signal terminal, and a second electrode of the third transistor is connected to the control node.

According to one embodiment of the present disclosure, the control module comprises a first transistor, a second transistor, a third transistor, a fourth transistor and a fifth transistor. A first electrode of the first transistor is connected to the first clock signal terminal, a second electrode of the first transistor is connected to a gate of the second transistor, and a gate of the first transistor is connected to a first electrode of the second transistor. The first electrode of the second transistor is connected to the first level terminal, and a second electrode of the second transistor is connected to a first terminal of the third transistor. The first electrode of the third transistor is connected to a gate of the fourth transistor, a second electrode of the third transistor is connected to the second level terminal, and a gate of the third transistor is connected to the input terminal. A first electrode of the fourth transistor is connected to the second clock signal terminal, and a second electrode of the fourth transistor is connected to a first electrode of the fifth transistor. A second electrode of the fifth transistor is connected to the control node, and a gate of the fifth transistor is connected to the first level terminal.

According to one embodiment of the present disclosure, the output module comprises a sixth transistor and a seventh transistor. A first electrode of the sixth transistor is connected to the first level terminal, a second electrode of the sixth transistor is connected to the output terminal, and a gate of the sixth transistor is connected to the control node. A first electrode of the seventh transistor is connected to the output terminal, a second electrode of the seventh transistor is connected to the second level terminal, and a gate of the seventh transistor is connected to the input terminal.

According to one embodiment of the present disclosure, the first clock signal at the first clock signal terminal and the second clock signal at the second clock signal terminal are opposite to each other, and both the first clock signal at the first clock signal terminal and the second clock signal at the second clock signal terminal have a duty cycle of 50%.

According to one embodiment of the present disclosure, all of the transistors are N type transistors, or all of the transistors are P type transistors.

According to another aspect of the present disclosure, there is provided a method for driving the inverter described above. The method comprises: during a first period, controlling the voltage at the control node by the control module under the control of the first clock signal at the first clock signal terminal, the second clock signal at the second clock signal terminal, the input signal at the input terminal, the voltage at the first level terminal and the voltage at the second level terminal, and setting the voltage at the output terminal to the voltage at the first level terminal by the output module under the control of the voltage at the control node; during a second period, setting the voltage at the output terminal to the voltage at the second level terminal by the output module under the control of the voltage at the control node and the input signal at the input terminal; during a third period, setting the voltage at the output terminal to the voltage at the second level terminal by the output module under the control of the voltage at the control node and the input signal at the input terminal; during a fourth period, controlling the voltage at the control node by the control module under the control of the first clock signal at the first clock signal terminal, the second clock signal at the second clock signal terminal, the input signal at the input terminal, the voltage at the first level terminal and the voltage at the second level terminal, and setting the voltage at the output terminal to the voltage at the first level terminal by the output module under the control of the voltage at the control node.

According to another aspect of the present disclosure, there is further provided a gate on array unit comprising an input unit, an inverter, an output control unit and an output unit. The input unit is connected to an input signal terminal and a first node, and is configured to set a voltage at the first node to a voltage of an input signal at the input signal terminal under the control of the input signal at the input signal terminal. The inverter is connected to a first level terminal, a second level terminal, a first clock signal terminal, a second clock signal terminal, the first node and a second node, and is configured to set a voltage at the second node to a voltage of the first level terminal or a voltage at the second level terminal under the control of the voltage at the first node, a first clock signal at the first clock signal terminal and a second clock signal at the second clock signal terminal. The output control unit is connected to the second node, the second level terminal and an output signal terminal, and is configured to set the voltage at the first node and an output signal at the output signal terminal to the voltage at the second level terminal under the control of the voltage at the second node. The output unit is connected to the first clock signal terminal, the first node and an output signal terminal, and is configured to output the first clock signal at the first clock signal terminal at the output signal terminal under the control of the first clock signal at the first clock signal terminal and the voltage at the first node.

According to one embodiment of the present disclosure, the inverter comprises a first transistor, a second transistor, a third transistor, a fourth transistor and a fifth transistor. A first electrode of the first transistor is connected to the first level terminal, a second electrode of the first transistor is connected to a first electrode of the second transistor, and a gate of the first transistor is connected to the first clock signal terminal. The first electrode of the second transistor is connected to a gate of the third transistor, a second electrode of the second transistor is connected to the second level terminal, and a gate of the second transistor is connected to the first node. A first electrode of the third transistor is connected to the second clock signal terminal, and a second electrode of the third transistor is connected to a gate of the fourth transistor. A first electrode of the fourth transistor is connected to the first level terminal, and a second electrode of the fourth transistor is connected to a first electrode of the fifth transistor. The first electrode of the fifth transistor is connected to the second node, a second electrode of the fifth transistor is connected to the second level terminal, and a gate of the fifth transistor is connected to the first node.

According to one embodiment of the present disclosure, the inverter comprises a first transistor, a second transistor, a third transistor, a fourth transistor, a fifth transistor, a sixth transistor and a seventh transistor. A first electrode of the first transistor is connected to the first clock signal terminal, a second electrode of the first transistor is connected to a gate of the second transistor, and a gate of the first transistor is connected to the first level terminal. A first electrode of the second transistor is connected to the gate of the first transistor, and a second electrode of the second transistor is connected to a first terminal of the third transistor. The first electrode of the third transistor is connected to a gate of the fourth transistor, a second electrode of the third transistor is connected to the second level terminal, and a gate of the third transistor is connected to the first node. A first electrode of the fourth transistor is connected to the second clock signal terminal, and a second electrode of the fourth transistor is connected to a first electrode of the fifth transistor. A second electrode of the fifth transistor is connected to a gate of the sixth transistor, and a gate of the fifth transistor is connected to a first electrode of the sixth transistor. The first electrode of the sixth transistor is connected to the first level terminal, and a second electrode of the sixth transistor is connected to the second node. A first electrode of the seventh transistor is connected to the second node, a second electrode of the seventh transistor is connected to the second level terminal, and a gate of the seventh transistor is connected to the first node.

According to one embodiment of the present disclosure, the input unit comprises an eighth transistor. A first electrode of the eighth transistor is connected to the input signal terminal, a second electrode of the eighth transistor is connected to the first node, and a gate of the eighth transistor is connected to the first electrode of the eighth transistor.

According to one embodiment of the present disclosure, the output control unit comprises a ninth transistor and a tenth transistor. A first electrode of the ninth transistor is connected to the first node, a second electrode of the ninth transistor is connected to the second level terminal, and a gate of the ninth transistor is connected to the second node. A first electrode of the tenth transistor is connected to the output signal terminal, a second electrode of the tenth transistor is connected to the second level terminal, and a gate of the tenth transistor is connected to the second node.

According to one embodiment of the present disclosure, the output unit comprises a capacitor and an eleventh transistor. A first electrode of the capacitor is connected to the first node, and a second electrode of the capacitor is connected to the output signal terminal. A first electrode of the eleventh transistor is connected to the first clock signal terminal, a second electrode of the eleventh transistor is connected to the output signal terminal, and a gate of the eleventh transistor is connected to the first electrode of the capacitor.

According to another aspect of the present disclosure, there is further provided a gate on array GOA circuit comprising at least two cascaded GOA units described above. The input signal terminal of the GOA unit at a first stage is connected to a frame start signal terminal, and the output signal terminal of the GOA unit at the first stage is connected to the input signal terminal of the GOA unit at a second stage; the input signal terminal of the GOA unit at a $n^{th}$ stage is connected to the output signal terminal of the GOA unit at an n−$1^{th}$ stage, and the output signal terminal of the GOA unit at the $n^{th}$ stage is connected to the input signal terminal of the GOA unit at a n+$1^{th}$ stage, where n is a positive integer.

According to another aspect of the present disclosure, there is further provided a display device comprising the GOA circuit described above.

In the inverter according to the embodiments of the present disclosure, the control module controls the voltage at the control node under the control of the first clock signal at the first clock signal terminal, the second clock signal at the second clock signal terminal, the input signal at the input signal terminal, the voltage at the first level terminal and the voltage at the second level terminal; the output module sets the voltage at the output signal terminal to the voltage at the first level terminal or the voltage at the second level terminal under the control of the control node and the input signal at the input signal terminal. That is, the output signal of the inverter according to the embodiments of the present disclosure is the voltage at the first level terminal or the voltage at the second level terminal. As compared to the inverter in the prior art, since both the voltage at the first level terminal and the voltage at the second level terminal have fixed values, the output signal of the inverter according to the embodiments of the present disclosure is not affected by the characteristics of TFTs, and thus the output signal is stable.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below are only some embodiments of the present disclosure, and based on the accompanying drawings, other accompanying drawings can be obtained by those skilled in the art without paying inventive labor.

FIG. 5 is a flowchart illustrating steps of a method for driving an inverter according to the embodiments of the present disclosure;

FIG. 6 is a schematic diagram illustrating timing sequence of respective signals of the inverter according to the embodiments of the present disclosure;

DETAILED DESCRIPTION

Figure 1:
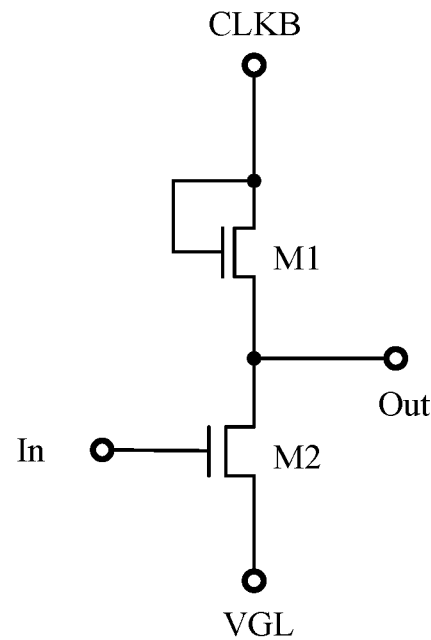
FIG. 1 is a schematic diagram illustrating structure of an inverter in the prior art.

Descriptions will be made clearly and thoroughly for the technical solutions in the embodiments of the present disclosure below, taken in conjunction with the accompanying drawings of the embodiments of the present disclosure. Obviously, the described embodiments are only some but not all of the embodiments of the present disclosure. Other embodiments obtained by those skilled in the art based on the described embodiments without paying inventive labor shall belong to the scope sought for protection in the present disclosure.

The transistors employed in all of the embodiments of the present disclosure can be Thin Film Transistors (TFTs), Field Effect Transistors (FETs), or other devices with the same characteristics. The transistors employed in the embodiments of the present disclosure mainly function as switching transistors in the circuits. Since a source and a drain of a switching transistor employed herein are symmetric, the source and the drain are exchangeable. In the embodiments of the present disclosure, to distinguish two electrodes of a transistor other than a gate thereof, a first electrode of the two electrodes is referred to as a source, and a second electrode of the two electrodes is referred to as a drain. For the pattern of a transistor in the accompanying drawings, a middle electrode is a gate, a signal input terminal is a source, and a signal output terminal is a drain. Besides, the switching transistors employed in the embodiments of the present disclosure may be N type switching transistors or P type switching transistors. A P type switching transistor is turned on when its gate is at a low level and is turned off when its gate is at a high level; and an N type switching transistor is turned on when its gate is at a high level and is turned off when its gate is at a low level. The driving transistor employed in the embodiments of the present disclosure may be N type driving transistor or P type driving transistor. A P type driving transistor operates in an amplification state or a saturation state when its gate voltage is at a low level (the gate voltage is lower than the source voltage) and an absolute value of the voltage difference between its gate and its source is larger than a threshold voltage thereof; and an N type driving transistor operates in an amplification state or a saturation state when its gate voltage is at a high level (the gate voltage is lower than the source voltage) and an absolute value of the voltage difference between its gate and its source is larger than a threshold voltage thereof.

It should be understood that, the terms "first", "second", "third" etc. are only used to distinguish elements or components having substantially same or similar function, rather than to define the number or the order of the elements or components. For example, in one embodiment, only "first transistor", "second transistor" and "fourth transistor"

appear and "third transistor" does not appear, the "first", "second" and "fourth" can only be construed as distinguishing of different transistors, rather than as that there is a third transistor in the embodiment.

Figure 2:
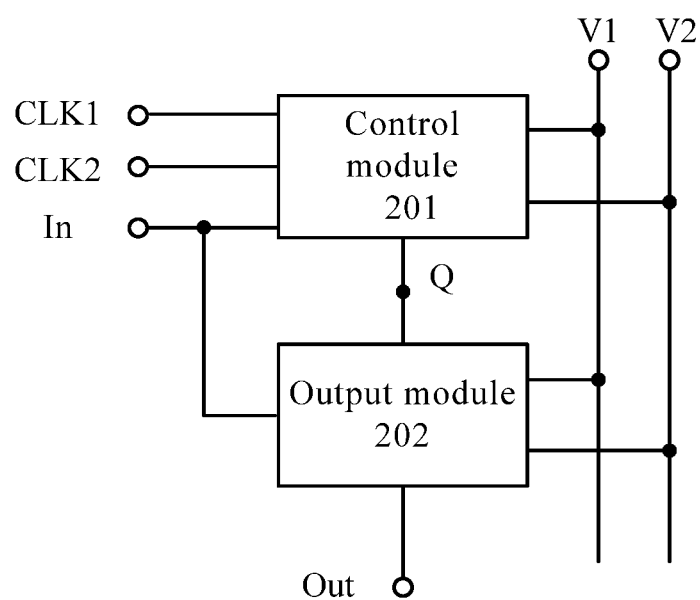
FIG. 2 is a schematic diagram illustrating structure of an inverter according to embodiments of the present disclosure.

According to the embodiments of the present disclosure, there is provided an inverter. With reference to FIG. 2, the inverter comprises a control module 201 and an output module 202.

The control module 201 is connected to a first clock signal terminal CLK1, a second clock signal terminal CLK2, a first level terminal V1, a second level terminal V2, an input terminal In and a control node Q, and is configured to control a voltage at the control node Q under the control of a first clock signal at the first clock signal terminal CLK1, a second clock signal at the second clock signal terminal CLK2, an input signal at the input terminal In, a voltage at the first level terminal V1 and a voltage at the second level terminal V2.

The output module 202 is connected to the control node Q, the input terminal In, the first level terminal V1, the second level terminal V2 and an output terminal Out, and is configured to set a voltage at the output terminal Out to the voltage at the first level terminal V1 or the voltage at the second level terminal V1 under the control of the control node Q and the input signal at the input terminal In.

In the inverter according to the embodiments of the present disclosure, the control module controls the voltage at the control node under the control of the first clock signal at the first clock signal terminal, the second clock signal at the second clock signal terminal, the input signal at the input terminal, the voltage at the first level terminal and the voltage at the second level terminal; the output module sets the voltage at the output terminal to the voltage at the first level terminal or the voltage at the second level terminal under the control of the control node and the input signal at the input terminal. That is, the output signal of the inverter according to the embodiments of the present disclosure is the voltage at the first level terminal or the voltage at the second level terminal. As compared to the inverter in the prior art, since both the voltage at the first level terminal and the voltage at the second level terminal have fixed values, the output signal of the inverter according to the embodiments of the present disclosure is not affected by the characteristics of TFTs, and thus the output signal is stable.

Figure 3:
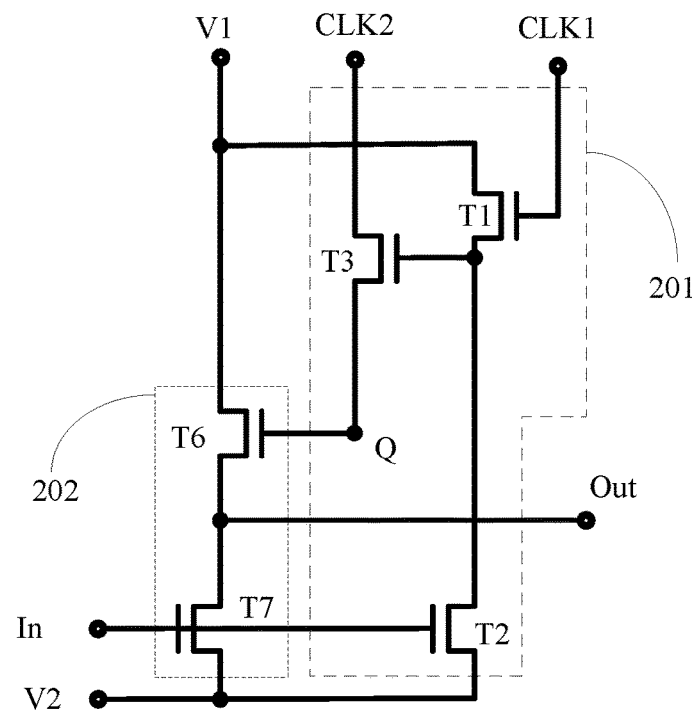
FIG. 3 is a schematic diagram illustrating structure of another inverter according to the embodiments of the present disclosure.

FIG. 3 illustrates specific structure of an inverter according to one embodiment of the present disclosure.

With reference to FIG. 3, the control module 201 comprises a first transistor T1, a second transistor T2 and a third transistor T3.

A first electrode of the first transistor T1 is connected to the first level terminal V1, a second electrode of the first transistor T1 is connected to a first electrode of the second transistor T2, and a gate of the first transistor is connected to the first clock signal terminal CLK1.

The first electrode of the second transistor T2 is connected to a gate of the third transistor T3, a second electrode of the second transistor T2 is connected to the second level terminal V2, and a gate of the second transistor T2 is connected to the input terminal In.

A first electrode of the third transistor T3 is connected to the second clock signal terminal CLK2, and a second electrode of the third transistor T3 is connected to the control node Q.

With reference to FIG. 3, the output module 202 comprises a sixth transistor T6 and a seventh transistor T7.

A first electrode of the sixth transistor T6 is connected to the first level terminal V1, a second electrode of the sixth transistor T6 is connected to the output terminal Out, and a gate of the sixth transistor T6 is connected to the control node Q.

A first electrode of the seventh transistor T7 is connected to the output terminal Out, a second electrode of the seventh transistor T7 is connected to the second level terminal V2, and a gate of the seventh transistor T7 is connected to the input terminal In.

Figure 4:
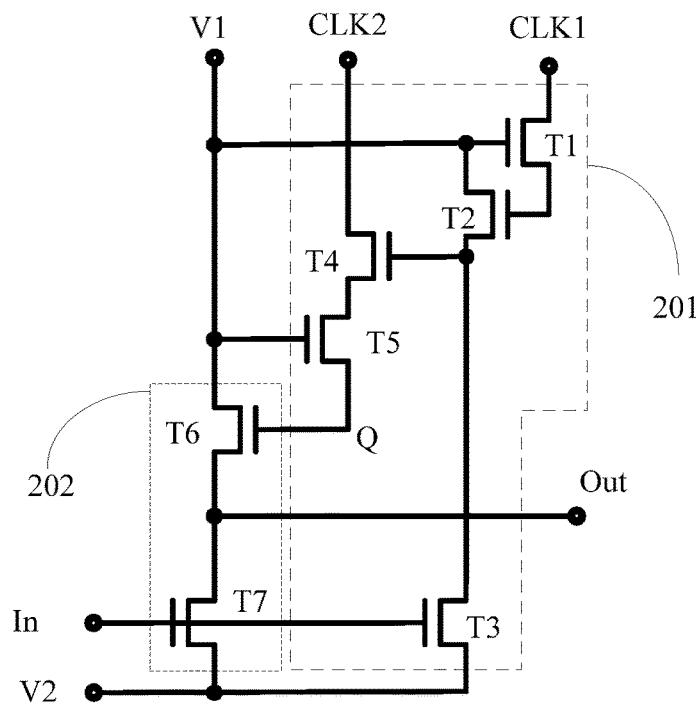
FIG. 4 is a schematic diagram illustrating structure of yet another inverter according to the embodiments of the present disclosure.

FIG. 4 illustrates specific structure of another inverter according to one embodiment of the present disclosure.

With reference to FIG. 4, the control module 201 comprises a first transistor T1, a second transistor T2, a third transistor T3, a fourth transistor T4 and a fifth transistor T5.

A first electrode of the first transistor T1 is connected to the first clock signal terminal CLK1, a second electrode of the first transistor T1 is connected to a gate of the second transistor T2, and a gate of the first transistor is connected to a first electrode of the second transistor T2.

The first electrode of the second transistor T2 is connected to the first level terminal V1, and a second electrode of the second transistor T2 is connected to a first terminal of the third transistor T3.

The first electrode of the third transistor T3 is connected to a gate of the fourth transistor T4, a second electrode of the third transistor is connected to the second level terminal V2, and a gate of the third transistor T3 is connected to the input terminal In.

A first electrode of the fourth transistor T4 is connected to the second clock signal terminal CLK2, and a second electrode of the fourth transistor T4 is connected to a first electrode of the fifth transistor T5.

A second electrode of the fifth transistor T5 is connected to the control node Q, and a gate of the fifth transistor is connected to the first level terminal V1.

With reference to FIG. 4, the output module 201 comprises a sixth transistor T6 and a seventh transistor T7.

A first electrode of the sixth transistor T6 is connected to the first level terminal V1, a second electrode of the sixth transistor T6 is connected to the output terminal Out, and a gate of the sixth transistor T6 is connected to the control node Q.

A first electrode of the seventh transistor T7 is connected to the output terminal Out, a second electrode of the seventh transistor T7 is connected to the second level terminal V2, and a gate of the seventh transistor T7 is connected to the input terminal In.

Commonly, significant power consumption will be generated when a clock signal terminal is connected to a gate of a transistor directly since the gate of the transistor consumes significant power. In the control module according to the embodiments of the present disclosure, the gate of the second transistor T2 is connected to the first clock signal terminal CLK1 through the first transistor T1, and the gate of the sixth transistor T6 is connected to the second clock signal terminal CLK2 through the fifth transistor T5, such that each of the clock signal terminals is not connected to a gate of a transistor directly, and thus power consumption of the inverter can be reduced.

It should be explained that several modules share a common signal terminal in the embodiments of the present disclosure, for example the control module and the output module share the first level terminal, such that number of the signal terminals in the inverter circuit can be reduced. However, these modules can be connected to different signal terminals respectively as long as these signal terminals supply similar signals.

FIG. 5 illustrates a method for driving an inverter according to the embodiments of the present disclosure. The method is adapted to drive the inverter as shown in FIG. 3 or FIG. 4. Specifically, with reference to FIG. 5, the method operates as follows.

During a first period SM, the control module controls the voltage at the control node under the control of the first clock signal at the first clock signal terminal, the second clock signal at the second clock signal terminal, the input signal at the input terminal, the voltage at the first level terminal and the voltage at the second level terminal, and the output module sets the voltage at the output terminal to the voltage at the first level terminal under the control of the voltage at the control node.

During a second period S52, the output module sets the voltage at the output terminal to the voltage at the second level terminal under the control of the voltage at the control node and the input signal at the input terminal.

During a third period S53, the output module sets the voltage at the output terminal to the voltage at the second level terminal under the control of the voltage at the control node and the input signal at the input terminal.

During a fourth period S54, the control module controls the voltage at the control node under the control of the first clock signal at the first clock signal terminal, the second clock signal at the second clock signal terminal, the input signal at the input terminal, the voltage at the first level terminal and the voltage at the second level terminal, and the output module sets the voltage at the output terminal to the voltage at the first level terminal under the control of the voltage at the control node.

In the method for driving the inverter according to the embodiments of the present disclosure, during the first period, the control module controls the voltage at the control node under the control of the first clock signal at the first clock signal terminal, the second clock signal at the second clock signal terminal, the input signal at the input terminal, the voltage at the first level terminal and the voltage at the second level terminal, and the output module sets the voltage at the output terminal to the voltage at the first level terminal under the control of the control node; during the second period and the third period, the output module sets the voltage at the output terminal to the voltage at the second level terminal under the control of the voltage at the control node and the input signal at the input terminal; during the fourth period, the output module sets the voltage at the output terminal to the voltage at the first level terminal under the control of the voltage at the control node. That is, with the method for driving the inverter according to the embodiments of the present disclosure, the output signal of the inverter is the voltage at the first level terminal or the voltage at the second level terminal, and is stable since both the voltage at the first level terminal and the voltage at the second level terminal have fixed values.

For example, the first clock signal at the first clock signal terminal and the second clock signal at the second clock signal terminal are opposite to each other, and both the first clock signal at the first clock signal terminal and the second clock signal at the second clock signal terminal have a duty cycle of 50%.

FIG. 6 is a schematic diagram illustrating timing sequences of respective signals of the inverter according to the embodiments of the present disclosure. Operational principles of the inverter as shown in FIG. 4 and the method for driving the inverter as shown in FIG. 5 will be described below with reference to FIG. 6 by taking it as an example that the voltage at the first level terminal V1 is a high level VGH and each of the transistors is a N type transistor which is turned on when its gate is supplied a high level.

It should be explained that the transistors T1 and T5 in the inverter as shown in FIG. 4 are normal-ON transistors when the voltage at the first level terminal V1 is a high level VGH and each of the transistors is a N type transistor, and thus an equivalent circuit of the inverter as shown in FIG. 4 in such condition is same as that of the inverter as shown in FIG. 3, and operational principle of the equivalent circuit of the inverter as shown in FIG. 4 in such condition is also same as that of the inverter as shown in FIG. 3. Only the operational principle of the inverter as shown in FIG. 4 is described below, and the operational principle of the inverter as shown in FIG. 3 can be obtained with reference to the operational principle of the inverter as shown in FIG. 4.

Specifically, the timing sequences of the first clock signal at the first clock signal terminal CLK1, the second clock signal at the second clock signal terminal CLK2, the input signal at the input terminal In and the output signal at the output terminal Out are shown in FIG. 6, where the first level terminal V1 and the second level terminal V2 supply stable voltages, for example the voltage at the first level terminal V1 is a high level VGH and the voltage at the second level terminal V2 is a low level VGL. As shown in FIG. 5, the timing sequences in four periods are discussed, that is, the first period t1, the second period t2, the third period t3 and the fourth period t4.

During the first period t1, the first clock signal terminal CLK1 is at a high level, the second clock signal terminal CLK2 and the input terminal In are at a low level, the gate of the first transistor T1 is connected to the first level terminal V1 which is at a high level VGH, the first transistor T1 is turned on such that the gate of the second transistor T2 is connected to the first clock signal terminal CLK1 through the first transistor T1, the second transistor T2 is turned on such that the gate of the fourth transistor T4 is connected to the first level terminal V1 through the second transistor T2, the fourth transistor T4 is turned on and a parasitic capacitor in the fourth transistor T4 is charged by the high level VGH at the first level terminal V1; the fifth transistor T5 is turned on since the gate of the fifth transistor T5 is connected to the first level terminal V1; the gate of the sixth transistor T6 is connected to the second clock signal terminal CLK2 through the fifth transistor T5 and the fourth transistor T4, and thus the sixth transistor T6 is turned off; the third transistor T3 and the seventh transistor T7 are turned off since the gates of the third transistor T3 and the seventh transistor T7 are connected to the input terminal In; the output terminal Out is at a high level since the seventh transistor T7 is turned off and there is an off current flowing through the sixth transistor T6 when the sixth transistor T6 is turned off.

During the second period t2, the first clock signal terminal CLK1 is at a low level, the second clock signal terminal CLK2 and the input terminal In are at a high level, the gate of the second transistor T2 is connected to the first clock signal terminal CLK1 through the first transistor T1 and thus the second transistor T2 is turned off; the third transistor T3 is turned on since the gate of the third transistor T3 is connected to the input terminal In, such that the gate of the fourth transistor T4 is connected to the second level terminal V2 through the third transistor T3 and thus the fourth transistor T4 is turned off; the fifth transistor T5 is turned on since the gate of the fifth transistor T5 is connected to the first level terminal V1; the sixth transistor T6 is turned off; the seventh transistor T7 is turned on since the gate of the seventh transistor T7 is connected to the input terminal In; the output terminal Out is at a low level since the output terminal Out is connected to the second level terminal V2 through the seventh transistor T7.

During the third period t3, the first clock signal terminal CLK1 is at a high level, the second clock signal terminal CLK2 is at a low level and the input terminal In is at a high level, the gate of the first transistor T1 is connected to the first level terminal V1 which is at a high level VGH, the first transistor T1 is turned on such that the gate of the second transistor T2 is connected to the first clock signal terminal CLK1 through the first transistor T1, the second transistor T2 is turned on, the third transistor T3 is turned on since the gate of the third transistor T3 is connected to the input terminal In, size of the second transistor T2 and size of the third transistor T3 are designed such that the gate of the fourth transistor T4 is at a high level and thus the fourth transistor T4 is turned on; the fifth transistor T5 is turned on since the gate of the fifth transistor T5 is connected to the first level terminal V1; the gate of the sixth transistor T6 is connected to the second clock signal terminal CLK2 through the fifth transistor T5 and the fourth transistor T4, and thus the sixth transistor T6 is turned off; the seventh transistor T7 is turned on since the gate of the seventh transistor T7 is connected to the input terminal In; the output terminal Out is at a low level since the output terminal Out is connected to the second level terminal V2 through the seventh transistor T7.

During the fourth period t4, the first clock signal terminal CLK1 is at a low level, the second clock signal terminal CLK2 is at a high level and the input terminal In is at a low level, the gate of the first transistor T1 is connected to the first level terminal V1 which is at a high level VGH, the first transistor T1 is turned on such that the gate of the second transistor T2 is connected to the first clock signal terminal CLK1 through the first transistor T1 and thus the second transistor T2 is turned off; the third transistor T3 is turned off since the gate of the third transistor T3 is connected to the input terminal In; the gate of the fourth transistor T4 cannot be connected to the first level terminal V1 through the second transistor T2, the fourth transistor T4 is turned off, and there is an off current flowing through the fourth transistor T4; the fifth transistor T5 is turned on since the gate of the fifth transistor T5 is connected to the first level terminal V1; the sixth transistor T6 is turned off; the seventh transistor T7 is turned off since the gate of the seventh transistor T7 is connected to the input terminal In; the output terminal Out is a high level since the seventh transistor T7 is turned off and there is an off current flowing through the sixth transistor T6.

One operation cycle of the inverter starts when the input terminal In changes from a low level to a high level during the first period t1 and ends when the input terminal In changes from a low level to a high level for a next time. That is, there may be several periods in the operation cycle of the inverter after the fourth period t4, which is determined by a duty cycle of the input signal at the input terminal In. After the fourth period t4 and before the input terminal In changes from a low level to a high level for a next time, the output terminal Out of the inverter outputs a high level.

In addition, all of the transistors in the inverter according to the embodiments of the present disclosure may be P type transistors which are turned on when their gates are supplied a low level. If all of the transistors in the inverter are P type transistors, it is necessary to adjust the timing sequences of the respective signals of the inverter. For example, the first level terminal V1 is adjusted to supply a low level, the first clock signal terminal is adjusted to be at a low level during the first period t1 in FIG. 6, the second clock signal terminal is adjusted to be at a high level during the first period t1 in FIG. 6, and other signals are adjusted to signals opposite thereto accordingly.

Furthermore, N type transistors and P type transistors can also be adopted concurrently in the inverter according to the embodiments of the present disclosure, as long as the transistors which are controlled by a same signal or voltage are of a same type. These variations or modifications are reasonable workarounds made by those skilled in the art on the basis of the embodiments of the present disclosure and should fall into the protection scope of the present disclosure. However, with consideration of manufacturing process of the transistors, adopting the transistors being of a same type in the inverter makes the manufacturing process easier since the different types of transistors have different active layer doped materials.

Figure 7:
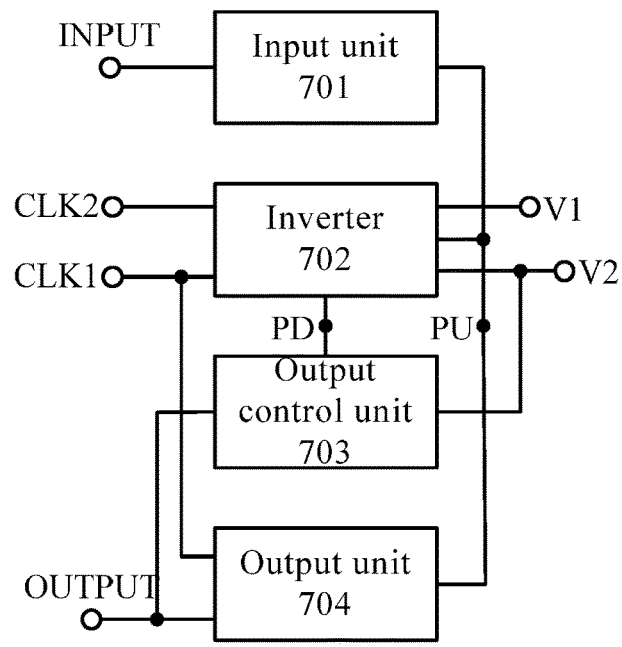
FIG. 7 is a schematic diagram illustrating structure of a GOA unit according to the embodiments of the present disclosure.

FIG. 7 illustrates a GOA unit according to the embodiments of the present disclosure. With reference to FIG. 7, the GOA unit comprises an input unit 701, an inverter 702, an output control unit 703 and an output unit 704.

The input unit 701 is connected to an input signal terminal INPUT and a first node PU, and is configured to set a voltage at the first node PU to a voltage of an input signal at the input signal terminal INPUT under the control of the input signal at the input signal terminal INPUT.

The inverter 702 is connected to a first level terminal V1, a second level terminal V2, a first clock signal terminal CLK1, a second clock signal terminal CLK2, the first node PU and a second node PD, and is configured to set a voltage at the second node PD to a voltage of the first level terminal V1 or a voltage at the second level terminal V2 under the control of the voltage at the first node PU, a first clock signal at the first clock signal terminal CLK1 and a second clock signal at the second clock signal terminal CLK2. It can be seen from the FIG. 2 and FIG. 7, the input terminal In and the output terminal Out of the inverter as shown in FIG. 2 correspond to the first node PU and the second node PD of the inverter 702 as shown in FIG. 7 respectively.

The output control unit 703 is connected to the second node PD, the second level terminal V2 and an output signal terminal OUTPUT, and is configured to set the voltage at the first node PU and an output signal at the output signal terminal OUTPUT to the voltage at the second level terminal V2 under the control of the voltage at the second node PD.

The output unit 704 is connected to the first clock signal terminal CLK1, the first node PU and the output signal terminal OUTPUT, and is configured to output the first clock signal at the first clock signal terminal CLK1 at the output signal terminal OUTPUT under the control of the first clock signal at the first clock signal terminal CLK1 and the voltage at the first node PU.

The inverter in the GOA unit according to the embodiments of the present disclosure can control the voltage at the second node stably by setting the voltage at the second node to the voltage at the first level terminal or the voltage at the second level terminal, and thus the GOA unit according to the embodiments of the present disclosure can output a stable gate driving voltage.

Figure 8:
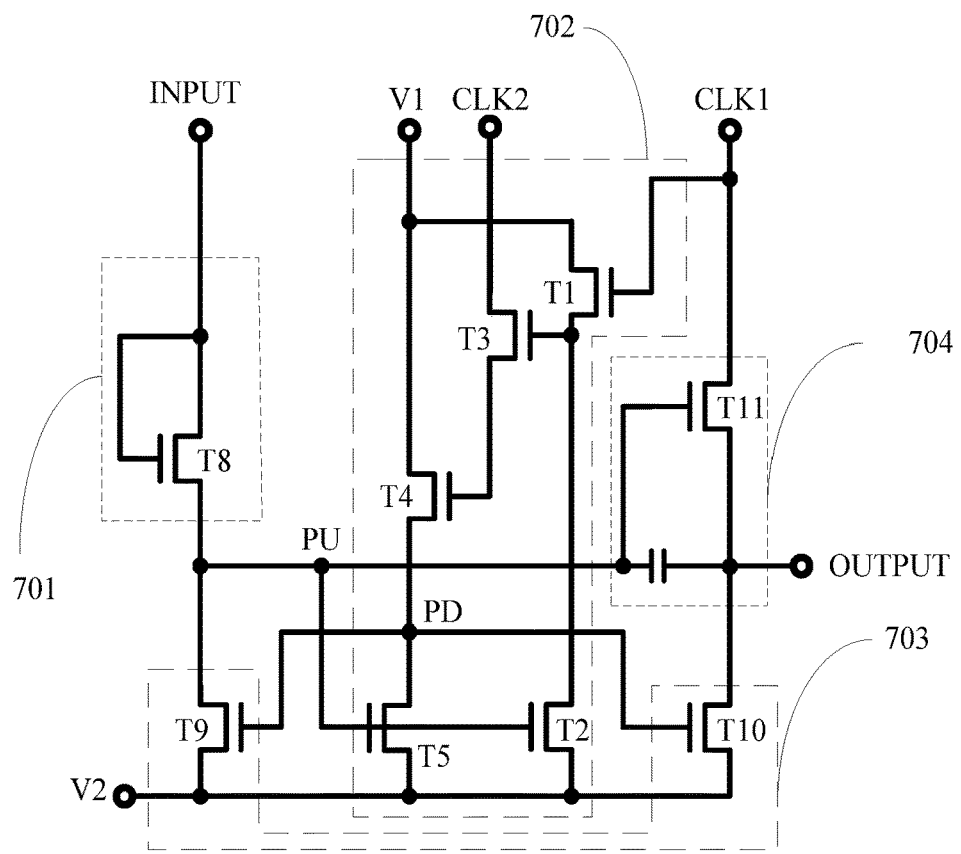
FIG. 8 is a schematic diagram illustrating structure of another GOA unit according to the embodiments of the present disclosure.

FIG. 8 illustrates specific structure of another GOA unit according to one embodiment of the present disclosure.

With reference to FIG. 8, the input unit 701 comprises an eighth transistor T8.

A first electrode of the eighth transistor T8 is connected to the input signal terminal INPUT, a second electrode of the eighth transistor T8 is connected to the first node PU, and a gate of the eighth transistor T8 is connected to the first electrode of the eighth transistor T8.

With reference to FIG. 8, the inverter 702 comprises: a first transistor T1, a second transistor T2, a third transistor T3, a fourth transistor T4 and a fifth transistor T5.

A first electrode of the first transistor T1 is connected to the first level terminal V1, a second electrode of the first transistor T1 is connected to a first electrode of the second transistor T2, and a gate of the first transistor T1 is connected to the first clock signal terminal CLK1.

The first electrode of the second transistor T2 is connected to a gate of the third transistor T3, a second electrode of the second transistor T2 is connected to the second level terminal V2, and a gate of the second transistor is connected to the first node PU.

A first electrode of the third transistor T3 is connected to the second clock signal terminal CLK2, and a second electrode of the third transistor is connected to a gate of the fourth transistor T4.

A first electrode of the fourth transistor T4 is connected to the first level terminal V1, and a second electrode of the fourth transistor T4 is connected to a first electrode of the fifth transistor T5.

The first electrode of the fifth transistor T5 is connected to the second node PD, a second electrode of the fifth transistor T5 is connected to the second level terminal V2, and a gate of the fifth transistor T5 is connected to the first node PU.

With reference to FIG. 8, the output control unit 703 comprises a ninth transistor T9 and a tenth transistor T10.

A first electrode of the ninth transistor T9 is connected to the first node PU, a second electrode of the ninth transistor T9 is connected to the second level terminal V2, and a gate of the ninth transistor T9 is connected to the second node PD.

A first electrode of the tenth transistor T10 is connected to the output signal terminal OUTPUT, a second electrode of the tenth transistor T10 is connected to the second level terminal V2, and a gate of the tenth transistor T10 is connected to the second node PD.

With reference to FIG. 8, the signal output unit 704 comprises a capacitor C and an eleventh transistor T11.

A first electrode of the capacitor C is connected to the first node PU, and a second electrode of the capacitor C is connected to the output signal terminal OUTPUT.

A first electrode of the eleventh transistor T11 is connected to the first clock signal terminal CLK1, a second electrode of the eleventh transistor T11 is connected to the output signal terminal OUTPUT, and a gate of the eleventh transistor T11 is connected to the first electrode of the capacitor C.

Figure 9:
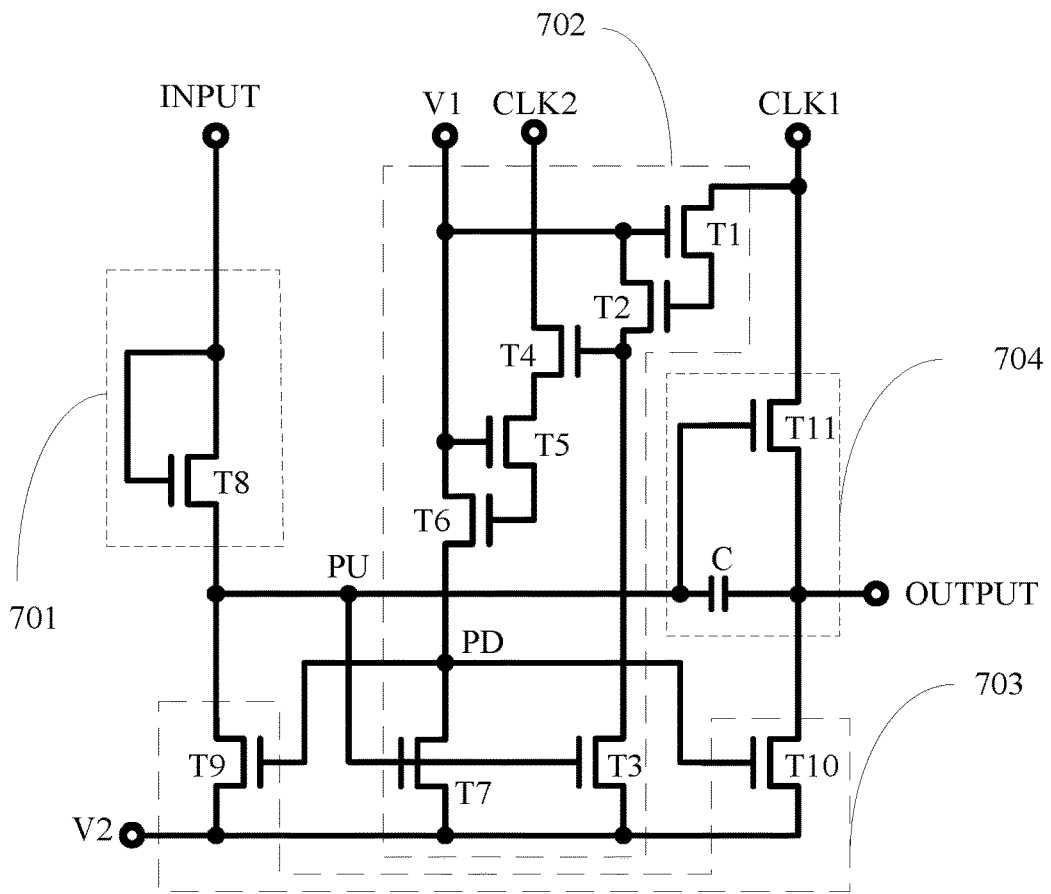
FIG. 9 is a schematic diagram illustrating structure of yet another GOA unit according to the embodiments of the present disclosure.

FIG. 9 illustrates specific structure of another GOA unit according to another embodiment of the present disclosure.

With reference to FIG. 9, the input unit 701 comprises an eighth transistor T8.

A first electrode of the eighth transistor T8 is connected to the input signal terminal INPUT, a second electrode of the eighth transistor T8 is connected to the first node PU, and a gate of the eighth transistor T8 is connected to the first electrode of the eighth transistor T8.

With reference to FIG. 9, the inverter 702 comprises: a first transistor T1, a second transistor T2, a third transistor T3, a fourth transistor T4, a fifth transistor T5, a sixth transistor T6 and a seventh transistor T7.

A first electrode of the first transistor T1 is connected to the first clock signal terminal CLK1, a second electrode of the first transistor T1 is connected to a gate of the second transistor T2, and a gate of the first transistor T1 is connected to the first level terminal V1.

A first electrode of the second transistor T2 is connected to the gate of the first transistor T1, and a second electrode of the second transistor T2 is connected to a first terminal of the third transistor T3.

The first electrode of the third transistor T3 is connected to a gate of the fourth transistor T4, a second electrode of the third transistor T3 is connected to the second level terminal V2, and a gate of the third transistor T3 is connected to the first node PU.

A first electrode of the fourth transistor T4 is connected to the second clock signal terminal CLK2, and a second electrode of the fourth transistor T4 is connected to a first electrode of the fifth transistor T5.

A second electrode of the fifth transistor T5 is connected to a gate of the sixth transistor T6, and a gate of the fifth transistor is connected to a first electrode of the sixth transistor T6.

The first electrode of the sixth transistor T6 is connected to the first level terminal V1, and a second electrode of the sixth transistor T6 is connected to the second node PD.

A first electrode of the seventh transistor T7 is connected to the second node PD, a second electrode of the seventh transistor T7 is connected to the second level terminal V2, and a gate of the seventh transistor T7 is connected to the first node PU.

With reference to FIG. 9, the output control unit 703 comprises a ninth transistor T9 and a tenth transistor T10.

A first electrode of the ninth transistor T9 is connected to the first node PU, a second electrode of the ninth transistor T9 is connected to the second level terminal V2, and a gate of the ninth transistor T9 is connected to the second node PD.

A first electrode of the tenth transistor T10 is connected to the output signal terminal OUTPUT, a second electrode of the tenth transistor T10 is connected to the second level terminal V2, and a gate of the tenth transistor T10 is connected to the second node PD.

With reference to FIG. 9, the output unit 704 comprises a capacitor C and an eleventh transistor T11.

A first electrode of the capacitor C is connected to the first node PU, and a second electrode of the capacitor C is connected to the output signal terminal OUTPUT.

A first electrode of the eleventh transistor T11 is connected to the first clock signal terminal CLK1, a second electrode of the eleventh transistor T11 is connected to the output signal terminal OUTPUT, and a gate of the eleventh transistor T11 is connected to the first electrode of the capacitor C.

Commonly, significant power consumption will be generated when a clock signal terminal is connected to a gate of a transistor directly since the gate of the transistor consumes significant power. In the GOA unit according to the embodiments of the present disclosure, the gate of the second transistor T2 is connected to the first clock signal terminal CLK1 through the first transistor T1, and the gate of the sixth transistor T6 is connected to the second clock signal terminal CLK2 through the fifth transistor T5, such that each of the clock signal terminals is not connected to a gate of a transistor directly, and thus power consumption of the inverter can be reduced.

Figure 10:
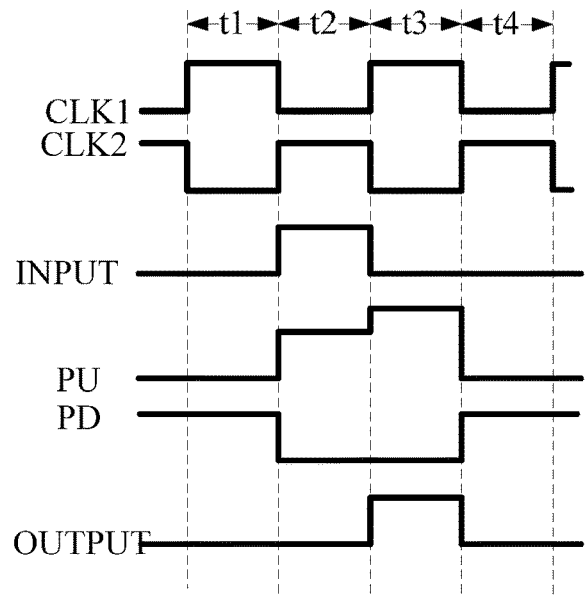
FIG. 10 is a schematic diagram illustrating timing sequence of respective signals of the GOA unit according to the embodiments of the present disclosure.

FIG. 10 is a schematic diagram illustrating timing sequences of respective signals of the GOA unit according to the embodiments of the present disclosure. Operational principles of the GOA unit as shown in FIG. 9 will be described below with reference to FIG. 10 by taking it as an example that the voltage at the first level terminal V1 is a high level VGH and each of the transistors is a N type transistor which is turned on when it gate is supplied a high level.

It should be explained that the transistors T1 and T5 in the GOA unit as shown in FIG. 9 are normal-ON transistors, that is, the gates of the transistors T1 and T5 are always at a high level and the transistors T1 and T5 are always turned on, when the voltage at the first level terminal V1 is a high level VGH and each of the transistors is a N type transistor, and thus an equivalent circuit of the GOA unit as shown in FIG. 9 in such condition is same as that of the GOA unit as shown in FIG. 8, and operational principle of the equivalent circuit of the GOA unit as shown in FIG. 9 in such condition is also same as that of the GOA unit as shown in FIG. 8. Only the operational principle of the GOA unit as shown in FIG. 9 is described hereinafter, and the operational principle of the GOA unit as shown in FIG. 8 can be obtained with reference to the operational principle of the GOA unit as shown in FIG. 9.

Specifically, the timing sequences of the first clock signal at the first clock signal terminal CLK1, the second clock signal at the second clock signal terminal CLK2, the input signal at the input signal terminal INPUT, the output signal at the output signal terminal OUTPUT, the voltage at the first node PU and the voltage at the second node PD are shown in FIG. 10, where the first level terminal V1 and the second level terminal V2 supply stable voltages, for example the voltage at the first level terminal V1 is a high level VGH and the voltage at the second level terminal V2 is a low level VGL. As shown in FIG. 10, the timing sequences in four periods are discussed, that is, the first period t1, the second period t2, the third period t3 and the fourth period t4.

During the first period t1, the first clock signal terminal CLK1 is at a high level, and the second clock signal terminal CLK2 and the input signal terminal INPUT are at a low level. With reference to the operational principle of the inverter during the first period t1 described above, the second node PD (i.e., the output terminal Out of the inverter as shown in FIG. 4) is at a high level, the ninth transistor T9 and the tenth transistor T10 are turned on, the first node PU (i.e., the input terminal In of the inverter as shown in FIG. 4) is at a low level and the output signal terminal OUTPUT is at a low level. This period functions as a discharging period.

During the second period t2, the first clock signal terminal CLK1 is at a low level, and the second clock signal terminal CLK2 and the input signal terminal INPUT are at a high level. With reference to the operational principle of the inverter during the second period t2 described above, the second node PD is at a low level, and the voltage at the first node PU is pulled up by the input signal terminal INPUT through the eighth transistor T8. The output signal terminal OUTPUT is at a low level since the first clock signal terminal CLK1 is at a low level. This period functions as a charging period.

During the third period t3, the first clock signal terminal CLK1 is at a high level, and the second clock signal terminal CLK2 and the input signal terminal INPUT is at a low level. With reference to the operational principle of the inverter during the third period t3 described above, the second node PD is at a low level, the ninth transistor T9 and the tenth transistor T10 are turned off, the eighth transistor T8 is turned off, the first node PU is floating, the capacitor C keeps the voltage across its two electrode unchanged, the eleventh transistor T11 is turned on and the high level of the first clock signal terminal CLK1 is outputted at the output signal terminal OUTPUT, that is, the output signal terminal OUTPUT is at a high level, and thus the first node PU is further pulled-up under the bootstrapping effect of the capacitor C. This period functions as a bootstrapping period or an outputting period.

During the fourth period t4, the first clock signal terminal CLK1 is at a low level, the second clock signal terminal CLK2 is at a high level and the input signal terminal INPUT is at a low level. With reference to the operational principle of the inverter during the fourth period t4 described above, the second node PD is at a high level, the ninth transistor T9 and the tenth transistor T10 are turned on, the capacitor C is discharged through the ninth transistor T9 and thus the first node PU is pulled down, the output signal terminal OUTPUT is discharged through the tenth transistor T10 and is thus at a low level.

One operation cycle of the GOA unit starts when the input changes from a low level to a high level during the first period t1 and ends when the input signal terminal INPUT changes from a low level to a high level for a next time. That is, there may be several periods in the operation cycle of the GOA unit after the fourth period t4, which is determined by rows scanned by a GOA circuit. After the fourth period t4 and before the input signal terminal INPUT of the GOA unit changes from a low level to a high level for a next time, the output signal terminal OUTPUT of the GOA unit is at a low level.

In addition, all of the transistors in the GOA unit according to the embodiments of the present disclosure may be P type transistors which are turned on when their gates are supplied a low level. If all of the transistors in the GOA unit are P type transistors, it is necessary to adjust the timing sequences of the respective signals of the GOA unit. For example, the first level terminal V1 is adjusted to supply a low level, the first clock signal terminal is adjusted to be at a low level during the first period t1 in FIG. 10, the second clock signal terminal is adjusted to be at a high level during the first period t1 in FIG. 10, and other signals are adjusted to signals opposite thereto accordingly.

Furthermore, N type transistors and P type transistors can also be adopted concurrently in the GOA unit according to the embodiments of the present disclosure, as long as the transistors which are controlled by a same signal or voltage are of a same type. These variations or modifications are reasonable workarounds made by those skilled in the art on the basis of the embodiments of the present disclosure and should fall into the protection scope of the present disclosure. However, with consideration of manufacturing process of the transistors, adopting the transistors being of a same type in the GOA unit makes the manufacturing process easier since the different types of transistors have different active layer doped materials.

Figure 11:
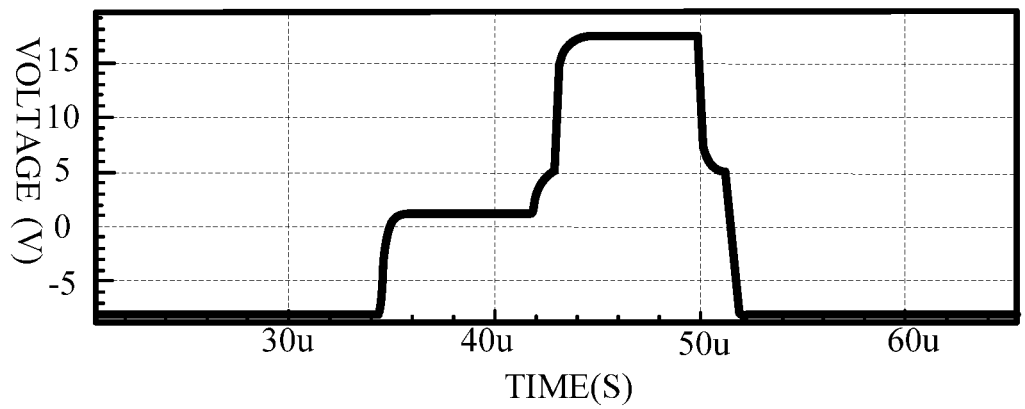
FIG. 11 is a simulated waveform of a voltage at a node PU according to the embodiments of the present disclosure.
Figure 12:
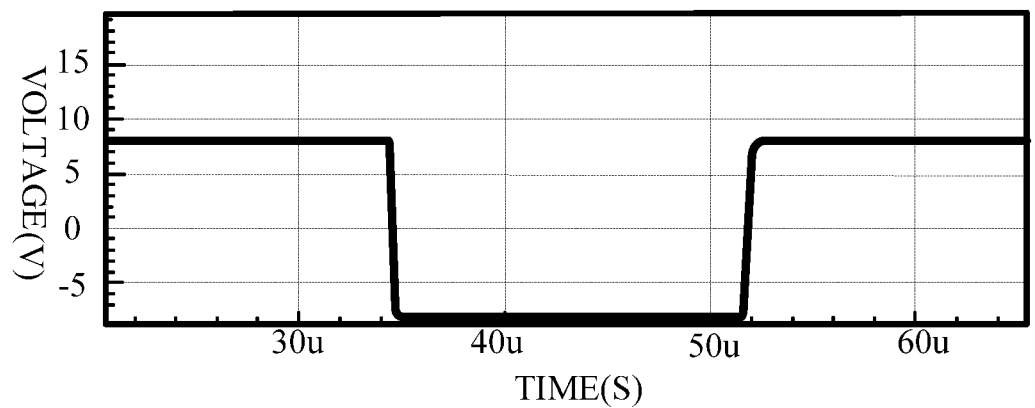
FIG. 12 is a simulated waveform of a voltage at a node PD according to the embodiments of the present disclosure.

FIG. 11 is a simulated waveform of a voltage varying with time at the node PU of the GOA unit; and FIG. 12 is a simulated waveform of a voltage varying with time at the node PD of the GOA unit.

It can be seen from FIG. 11 that the voltage at the node PU is pulled-up two times, the first one corresponds to the second period in the above embodiment of the present disclosure, and the second one corresponds to the third period in the above embodiment of the present disclosure. It can be seen from FIG. 12 that the voltage at the node PD is at a stable low level during the two periods where the node PU is pulled-up. The operational principle of the GOA unit according to the embodiments of the present disclosure and the technical effect achieved by the embodiments of the present disclosure are verified from the simulated waveforms of the voltages varying with time of the nodes PU and PD.

Figure 13:
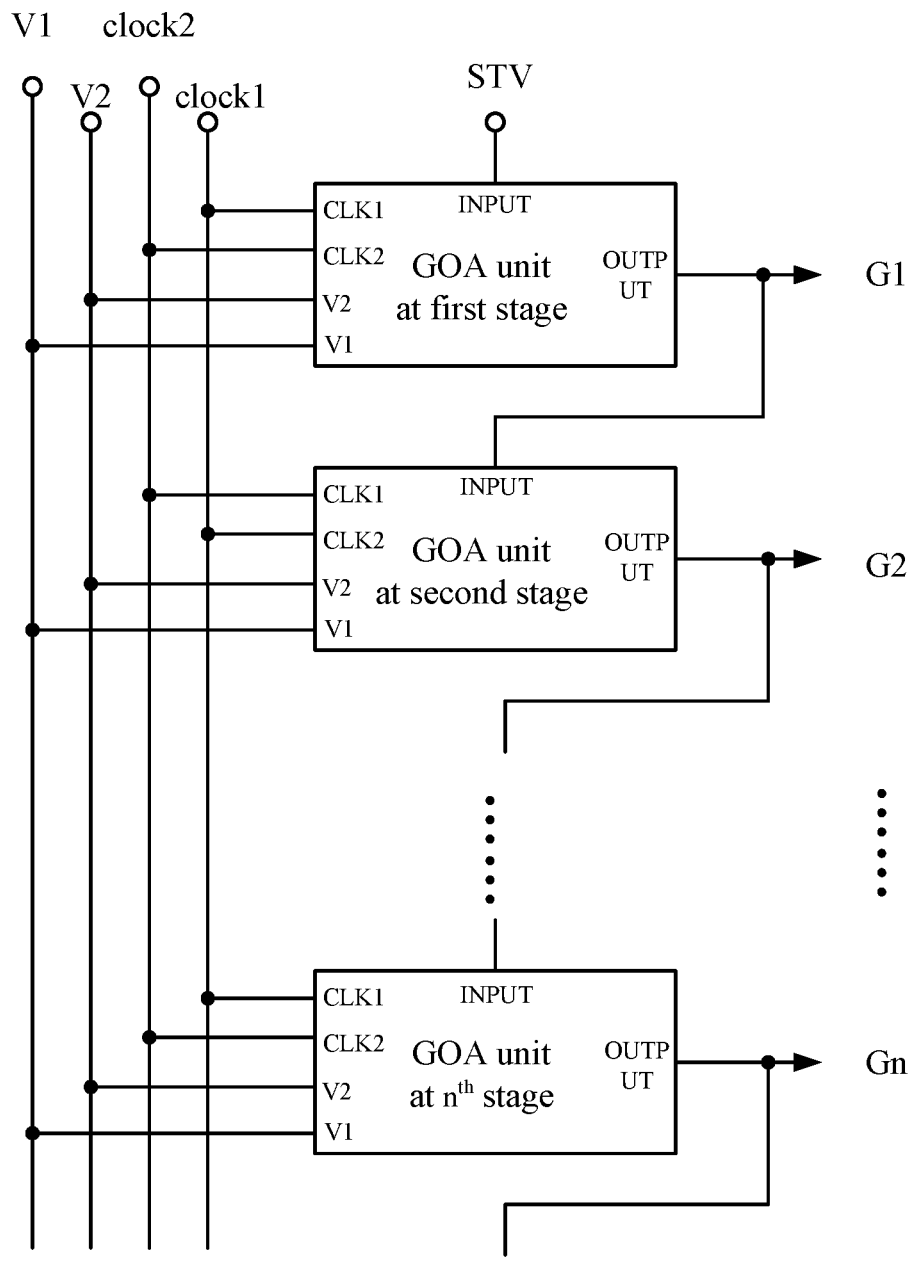
FIG. 13 is a schematic diagram illustrating structure of a GOA circuit according to the embodiments of the present disclosure.

According to another aspect of the present disclosure, there is provided a GOA circuit. With reference to FIG. 13, the GOA unit comprises at least two GOA units according to the embodiments of the present disclosure.

The input signal terminal of the GOA unit at a first stage is connected to a frame start signal terminal, and the output signal terminal of the GOA unit at the first stage is connected to the input signal terminal of the GOA unit at a second stage; the input signal terminal of the GOA unit at a $n^{th}$ stage is connected to the output signal terminal of the GOA unit at an $n-1^{th}$ stage, and the output signal terminal of the GOA unit at the $n^{th}$ stage is connected to the input signal terminal of the GOA unit at a $n+1^{th}$ stage, where n is a positive integer.

Specifically, with reference to FIG. 13, the GOA unit comprises a plurality of cascaded GOA units. The input signal terminal of the GOA unit at a first stage is connected to a frame start signal terminal, and the output signal terminal of the GOA unit at the first stage is connected to the input signal terminal of the GOA unit at a second stage and a gate line G1; the input signal terminal of the GOA unit at the second stage is connected to the output signal terminal of the GOA unit at the first stage, and the output signal terminal of the GOA unit at the second is connected to the input signal terminal of the GOA unit at a third stage and a gate line G2; each of the other GOA units in the GOA circuit is connected in a manner same as that in which the GOA unit in the second stage is connected.

Each of the GOA units has a first clock signal terminal CLK1, a second clock signal terminal CLK2 and two level input terminals. With reference to FIG. 13, the two clock signal terminals CLK1 and CLK2 of each of the GOA units are supplied clock signals by two systematical clock signals clock1 and clock2. Specifically, clock1 is input the first clock signal terminal CLK1 of the GOA unit at the first stage, clock2 is input the second clock signal terminal CLK2 of the GOA unit at the first stage; clock2 is input the first clock signal terminal CLK1 of the GOA unit at the second stage, clock1 is input the second clock signal terminal CLK2 of the GOA unit at the second stage; for the GOA unit at a $n^{th}$ stage, the respective clock signal terminals of the GOA unit at the $n^{th}$ stage and the respective clock signal terminals of the GOA unit at the first stage have same clock signals inputted thereto when n is an odd number, and the respective clock signal terminals of the GOA unit at the $n^{th}$ stage and the respective clock signal terminals of the GOA unit at the second stage have same clock signals inputted thereto when n is an even number. In FIG. 13, illustration is given by taking that n is an odd number as an example.

With reference to FIG. 10, the timing sequences of the systematical clocks can be the first clock signal at the first clock signal terminal CLK1 and the second clock signal at the second clock signal terminal CLK2. The clock signals clock1 and clock2 are opposite to each other and have a duty cycle of 50%.

The inverter in the GOA circuit according to the embodiments of the present disclosure can set the voltage at the second node to the voltage at the first level terminal or the voltage at the second level terminal, such that the inverter in the GOA circuit can control the voltage at the second node stably, and thus the GOA circuit can output stable gate driving voltages.

According to another aspect of the present disclosure, there is further provided a display device comprising the GOA circuit according to the embodiments of the present disclosure.

The display device may be any product or means possessing display function, such as an electronic paper, a mobile phone, a pad computer, a television, a display, a notebook computer, a digital photo frame, a navigator and the like.

The inverter in the GOA circuit in the display device according to the embodiments of the present disclosure can set the voltage at the second node to the voltage at the first level terminal or the voltage at the second level terminal, such that the inverter in the GOA circuit can control the voltage at the second node stably, the GOA circuit can output stable gate driving voltages, and thus stable display of the display device can be ensured.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. An inverter comprising a control module and an output module,
   wherein the control module comprises a first sub-circuit, a second sub-circuit and a third sub-circuit, the first sub-circuit is connected to a first clock signal terminal, a first level terminal and a first node, the second sub-circuit is connected to a second level terminal, an input terminal, the first node, the third sub-circuit is connected to a control node, a second clock signal terminal and the first node and is configured to deliver a second clock signal at the second clock signal terminal to the control node under the control of the first node,
   wherein the control module is configured to control a voltage at the control node under the control of a first clock signal at the first clock signal terminal, the second clock signal at the second clock signal terminal, an input signal at the input terminal, a voltage at the first level terminal and a voltage at the second level terminal,
   wherein the output module is connected to the control node, the input terminal, the first level terminal, the second level terminal and an output terminal, and is configured to set a voltage at the output terminal to the voltage at the first level terminal or the voltage at the second level terminal under the control of the control node and the input signal at the input terminal, and
   wherein the first sub-circuit comprises a first transistor, the second sub-circuit comprises a second transistor and the third sub-circuit comprises a third transistor,
   a first electrode of the first transistor is connected to the first level terminal, a second electrode of the first transistor is connected to a first electrode of the second transistor, and a gate of the first transistor is connected to the first clock signal terminal,
   the first electrode of the second transistor is connected to a gate of the third transistor, a second electrode of the second transistor is connected to the second level terminal, and a gate of the second transistor is connected to the input signal terminal, a first electrode of the third transistor is connected to the second clock signal terminal, and
a second electrode of the third transistor is connected to the control node.

2. The inverter of claim 1, wherein the output module comprises a sixth transistor and a seventh transistor,
a first electrode of the sixth transistor is connected to the first level terminal, a second electrode of the sixth transistor is connected to the output terminal, and a gate of the sixth transistor is connected to the control node;
a first electrode of the seventh transistor is connected to the output terminal, a second electrode of the seventh transistor is connected to the second level terminal, and a gate of the seventh transistor is connected to the input terminal.

3. The inverter of claim 1, wherein the first dock signal at the first clock signal terminal and the second clock signal at the second clock signal terminal are opposite to each other, and both the first clock signal at the first clock signal terminal and the second clock signal at the second clock signal terminal have a duty cycle of 50%.

4. The inverter of claim 2, wherein all of the transistors are N type transistors, or of the transistors are P type transistors.

5. A method for driving the inverter of claim 1, comprising:
during a first period, controlling the voltage at the control node by the control module under the control of the first clock signal at the first clock signal terminal, the second clock signal at the second clock signal terminal, the input signal at the input terminal, the voltage at the first level terminal and the voltage at the second level terminal, and setting the voltage at the output terminal to the voltage at the first level terminal by the output module under the control of the voltage at the control node;
during a second period, setting the voltage at the output terminal to the voltage at the second level terminal by the output module under the control of the voltage at the control node and the input signal at the input terminal;
during a third period, setting the voltage at the output terminal to the voltage at the second level terminal by the output module under the control of the voltage at the control node and the input signal at the input terminal;
during a fourth period, controlling the voltage at the control node by the control module under the control of the first clock signal at the first clock signal terminal, the second clock signal at the second clock signal terminal, the input signal at the input terminal, the voltage at the first level terminal and the voltage at the second level terminal, and setting the voltage at the output terminal to the voltage at the first level terminal by the output module under the control of the voltage at the control node.

6. A gate on array (GOA) unit comprising an input unit, the inverter of claim 1, an output control unit and an output unit,
wherein the input unit is connected to an input signal terminal and the input terminal, and is configured to set a voltage at the input terminal to a voltage of an input signal at the input signal terminal under the control of the input signal at the input signal terminal,
wherein the inverter is connected to the first level terminal, the second level terminal, the first clock signal terminal, the second clock signal terminal, the input terminal and the output terminal, and is configured to set a voltage at the output terminal to the voltage of the first level terminal or the voltage at the second level terminal under the control of the voltage at the input terminal, the first clock signal at the first clock signal terminal and the second clock signal at the second clock signal terminal,
wherein the output control unit is connected to the output terminal, the second level terminal and an output signal terminal, and is configured to set the voltage at the input terminal and an output signal at the output signal terminal to the voltage at the second level terminal under the control of the voltage at the output terminal,
wherein the output unit is connected to the first clock signal terminal, the input terminal and the output signal terminal, and is configured to output the first clock signal at the first clock signal terminal at the output signal terminal under the control of the first clock signal at the first clock signal terminal and the voltage at the input terminal.

7. The GOA unit of claim 6, wherein the output module of the inverter comprises a sixth transistor and a seventh transistor,
a first electrode of the sixth transistor is connected to the first level terminal, and a second electrode of the sixth transistor is connected to a first electrode of the seventh transistor and a gate of the sixth transistor is connected to the control node;
the first electrode of the seventh transistor is connected to the input terminal, a second electrode of the seventh transistor is connected to the second level terminal, and a gate of the seventh transistor is connected to the input terminal.

8. The GOA unit of claim 7, wherein the input unit comprises an eighth transistor,
a first electrode of the eighth transistor is connected to the input signal terminal, a second electrode of the eighth transistor is connected to the input terminal, and a gate of the eighth transistor is connected to the first electrode of the eighth transistor.

9. The GOA unit of claim 7, wherein the output control unit comprises a ninth transistor and a tenth transistor,
a first electrode of the ninth transistor is connected to the input terminal, a second electrode of the ninth transistor is connected to the second level terminal, and a gate of the ninth transistor is connected to the output terminal;
a first electrode of the tenth transistor is connected to the output signal terminal, a second electrode of the tenth transistor is connected to the second level terminal, and a gate of the tenth transistor is connected to the output terminal.

10. The GOA unit of claim 7, wherein the output unit comprises a capacitor and an eleventh transistor,
a first electrode of the capacitor is connected to the input terminal, and a second electrode of the capacitor is connected to the output signal terminal;
a first electrode of the eleventh transistor is connected to the first clock signal terminal, a second electrode of the eleventh transistor is connected to the output signal terminal, and a gate of the eleventh transistor is connected to the first electrode of the capacitor.

11. A gate on array (GOA) circuit comprising at least two cascaded GOA units of claim 6, wherein
the input signal terminal of the GOA unit at a first stage is connected to a frame start signal terminal, and the output signal terminal of the GOA unit at the first stage is connected to the input signal terminal of the GOA unit at a second stage;

the input signal terminal of the GOA unit at a nth stage is connected to the output signal terminal of the GOA unit at an n−1th stage, and the output signal terminal of the GOA unit at the nth stage is connected to the input signal terminal of the GOA unit at a n+1th stage, wherein n is a positive integer.

12. A inverter comprising a control module and an output module,
wherein the control module comprises a first sub-circuit, a second sub-circuit and a third sub-circuit, the first-sub-circuit is connected to a first clock signal terminal, a first level terminal and a first node, the second sub-circuit is connected to a second level terminal, an input terminal, the first node, the third sub-circuit is connected to a control node, a second clock signal terminal and the first node and is configured to deliver a second clock signal at the second clock signal terminal to the control node under the control of the first node,
wherein the control module is configured to control a voltage at the control node under the control of a first clock signal at the first clock signal terminal, the second clock signal at the second clock signal terminal, an input signal at the input, terminal, a voltage at the first level terminal and a voltage at the second level terminal,
wherein the output module is connected to the control node, the input terminal, the first level terminal, the second level terminal and an output terminal, and is configured to set a voltage at the output terminal to the voltage at the first level terminal or the voltage at the second level terminal under the control of the control node and the input signal at the input terminal, and
wherein the first sub-circuit comprises a first transistor, a second transistor, the second sub-circuit comprises a third transistor, and the third sub-circuit is further connected to the first level terminal and comprises a fourth transistor and a fifth transistor,
a first electrode of the first transistor is connected to the first clock signal terminal, a second electrode of the first transistor is connected to a gate of the second transistor, and a gate of the first transistor is connected to a first electrode of the second transistor,
the first electrode of the second transistor is connected to the first level terminal, and a second electrode of the second transistor is connected to a first electrode of the third transistor,
the first electrode of the third transistor is connected to a gate of the fourth transistor, a second electrode of the third transistor is connected to the second level terminal, and a gate of the third transistor is connected to the input terminal,
a first electrode of the fourth transistor is connected to the second clock signal terminal, and a second electrode of the fourth transistor is connected to a first electrode of the fifth transistor, and
a second electrode of the fifth transistor is connected to the control node, and a gate of the fifth transistor is connected to the first level terminal.

13. The inverter of claim 12, wherein the output module comprises a sixth transistor and a seventh transistor,
a first electrode of the sixth transistor is connected to the first level terminal, a second electrode of the sixth transistor is connected to the output terminal, and a gate of the sixth transistor is connected to the control node;
a first electrode of the seventh transistor is connected to the output terminal, a second electrode of the seventh transistor is connected to the second level terminal, and a gate of the seventh transistor is connected to the input terminal.

14. The inverter of claim 13, wherein all of the transistors are N type transistors, or all of the transistors are P type transistors.

15. A gate on array GOA unit comprising an input unit, the inverter of claim 12, an output control unit and an output unit,
wherein the input unit is connected to an input signal terminal and the input terminal, and is configured to set a voltage at the input terminal to a voltage of an input signal at the input signal terminal under the control of the input signal at the input signal terminal,
wherein the inverter is connected to the first level terminal, the second level terminal, the first clock signal terminal, the second clock signal terminal, the input terminal and the output terminal, and is configured to set a voltage at the output terminal to the voltage of the first level terminal or the voltage at the second level terminal under the control of the voltage at the input terminal, the first clock signal at the first clock signal terminal and the second clock signal at the second clock signal terminal,
wherein the output control unit is connected to the output terminal, the second level terminal and an output signal terminal, and is configured to set the voltage at the input terminal and an output signal at the output signal terminal to the voltage at the second level terminal under the control of the voltage at the output terminal.

16. The GOA unit of claim 15, wherein the input unit comprises an eighth transistor,
a first electrode of the eighth transistor is connected to the input signal terminal, a second electrode of the eighth transistor is connected to the input terminal, and a gate of the eighth transistor is connected to the first electrode of the eighth transistor.

17. The GOA unit of claim 15, wherein the output control unit comprises a ninth transistor and a tenth transistor,
a first electrode of the ninth transistor is connected to the input terminal, a second electrode of the ninth transistor is connected to the second level terminal, and a gate of the ninth transistor is connected to the output terminal;
a first electrode of the tenth transistor is connected to the output signal terminal, a second electrode of the tenth transistor is connected to the second level terminal, and a gate of the tenth transistor is connected to the output terminal.

18. The GOA unit of claim 15, wherein the output unit comprises a capacitor and an eleventh transistor,
a first electrode of the capacitor is connected to the input terminal, and a second electrode of the capacitor is connected to the output signal terminal;
a first electrode of the eleventh transistor is connected to the first clock signal terminal, a second electrode of the eleventh transistor is connected to the output signal terminal, and a gate of the eleventh transistor is connected to the first electrode of the capacitor.

19. The GOA unit of claim 15, wherein the output module of the inverter comprises a sixth transistor and a seventh transistor,
wherein the first electrode of the sixth transistor is connected to the first level terminal, and a second electrode of the sixth transistor is connected to the output terminal a gate of the sixth transistor is connected to the control node, and a first electrode of the seventh transistor is connected to the output terminal, a second electrode of the seventh transistor is connected to the second level terminal, and a gate of the seventh transistor is connected to the input terminal.

\* \* \* \* \*